(12) United States Patent
Maly et al.

(10) Patent No.: US 7,818,646 B1
(45) Date of Patent: Oct. 19, 2010

(54) EXPECTATION BASED EVENT VERIFICATION

(75) Inventors: John Warren Maly, LaPorte, CO (US); Ryan Clarence Thompson, Loveland, CO (US); Zachary Steven Smith, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2050 days.

(21) Appl. No.: 10/712,902

(22) Filed: Nov. 12, 2003

(51) Int. Cl.
G01R 31/28 (2006.01)
G01R 31/26 (2006.01)
G06F 11/00 (2006.01)
G11C 29/00 (2006.01)

(52) U.S. Cl. .................. 714/741; 714/25; 714/718; 714/724; 365/201; 324/765

(58) Field of Classification Search .................. None
See application file for complete search history.

(56) References Cited

U.S. PATENT DOCUMENTS

| | | | | |
|---|---|---|---|---|
| 3,614,608 A * | 10/1971 | Giedd et al. | ............... | 714/736 |
| 5,051,938 A * | 9/1991 | Hyduke | ............... | 703/15 |
| 5,515,384 A * | 5/1996 | Horton, III | ............... | 714/732 |
| 5,570,376 A * | 10/1996 | Kunda et al. | ............... | 714/736 |
| 5,617,429 A * | 4/1997 | Goto | ............... | 714/736 |
| 5,640,403 A * | 6/1997 | Ishiyama et al. | ............... | 714/737 |
| 5,790,565 A * | 8/1998 | Sakaguchi | ............... | 714/738 |
| 5,831,996 A * | 11/1998 | Abramovici et al. | ............... | 714/738 |
| 5,903,475 A * | 5/1999 | Gupte et al. | ............... | 703/16 |
| 6,493,841 B1 * | 12/2002 | Kim et al. | ............... | 714/741 |
| 6,564,349 B1 * | 5/2003 | Mitten et al. | ............... | 714/733 |
| 6,820,220 B1 * | 11/2004 | Dominke et al. | ............... | 714/30 |
| 6,885,956 B2 * | 4/2005 | Baba | ............... | 702/83 |
| 6,938,236 B1 * | 8/2005 | Park et al. | ............... | 716/17 |
| 7,111,214 B1 * | 9/2006 | Chaudhary et al. | ............... | 714/725 |
| 7,165,231 B2 * | 1/2007 | Buckley, Jr. | ............... | 716/5 |
| 7,292,970 B1 * | 11/2007 | Hurlock | ............... | 703/23 |
| 7,526,422 B1 * | 4/2009 | Nemecek | ............... | 703/28 |
| 2001/0013110 A1 * | 8/2001 | Pierce et al. | ............... | 714/718 |
| 2002/0120891 A1 * | 8/2002 | Bartenstein et al. | ............... | 714/724 |
| 2002/0138800 A1 * | 9/2002 | Kim et al. | ............... | 714/719 |
| 2002/0188888 A1 * | 12/2002 | Rivoir | ............... | 714/25 |
| 2005/0010886 A1 * | 1/2005 | Urata et al. | ............... | 716/6 |
| 2005/0108596 A1 * | 5/2005 | Deaton | ............... | 714/41 |

* cited by examiner

Primary Examiner—Jeffrey A Gaffin
Assistant Examiner—Guerrier Merant

(57) ABSTRACT

A computer implemented method of verifying events generated by an agent includes detecting an input signal at an input of the agent, generating an expected output signal based at least in part on the input signal, detecting an output signal at an output of the agent, wherein the output signal is a translation of the input signal generated by the agent, and comparing the output signal with the expected output signal to verify whether the agent produced the output signal correctly based on the input signal.

25 Claims, 5 Drawing Sheets

EXPECTATION BASED EVENT VERIFICATION

BACKGROUND

Designing and testing a computer architecture is an extremely complex process, involving a range of tasks from the high level such as specifying the architecture down to the low level such as determining the physical placement of transistors on a silicon substrate. Each stage of the design process requires extensive testing and verification of the design through that stage. The computer architecture is typically simulated during the design process before building and testing the hardware.

The testing process is complicated further for architectures supporting multiple cache memories. For example, a computer architecture may support multiple processors having either a shared memory, multiple dedicated memories, or both, as well as multiple cache memories (referred to hereinafter simply as caches). Multiple memory agents are also provided to handle memory operations or transactions in the system that access the shared memory or other memories and the caches. For example, one of the processors may initiate a read transaction to read a line of memory. The line of memory may be stored in one or more locations in the system, such as in the shared memory and in one or more of the caches. The memory agents work together to determine the source from which the line of memory should be read for the processor.

The memory agents and memories may be connected in a number of ways, such as by a bus or by a point to point link network using any of a number of suitable protocols. A single memory transaction may therefore be quite complex, involving requests and data being sent back and forth among the multiple memory agents, memories and caches. The sequence of data transmissions depends upon the type of transaction (read, write, etc.), the locations and states of the line of memory in the system, the bus protocol employed, etc. Therefore, testing the operation of the memory agents in the system can be an extremely complex and data-intensive procedure.

SUMMARY

An exemplary embodiment may comprise a computer implemented method of verifying events generated by an agent, including detecting an input signal at an input of the agent, generating an expected output signal based at least in part on the input signal, detecting an output signal at an output of the agent, wherein the output signal is a translation of the input signal generated by the agent, and comparing the output signal with the expected output signal to verify whether the agent produced the output signal correctly based on the input signal.

Another exemplary embodiment may comprise an apparatus for producing expectations to verify events generated by an agent, the apparatus including at least one computer readable medium having computer readable program code stored thereon. The computer readable program code includes program code for monitoring at least one input of the agent for a stimulus, program code for producing an expectation of an event, wherein the event is expected to be generated by the agent as a result of the stimulus, and program code for monitoring at least one output of the agent for the event.

Another exemplary embodiment may comprise an apparatus for testing an agent in a computer system. The apparatus includes means for detecting at least one incoming message as it is received by the agent, means for determining at least one expected outgoing message that should be produced by the agent in response to the incoming message, and means for verifying whether the agent generates an outgoing message matching the expected outgoing message.

BRIEF DESCRIPTION OF THE DRAWINGS

Illustrative embodiments are shown in the accompanying drawings, in which.

DESCRIPTION

Figure 1:
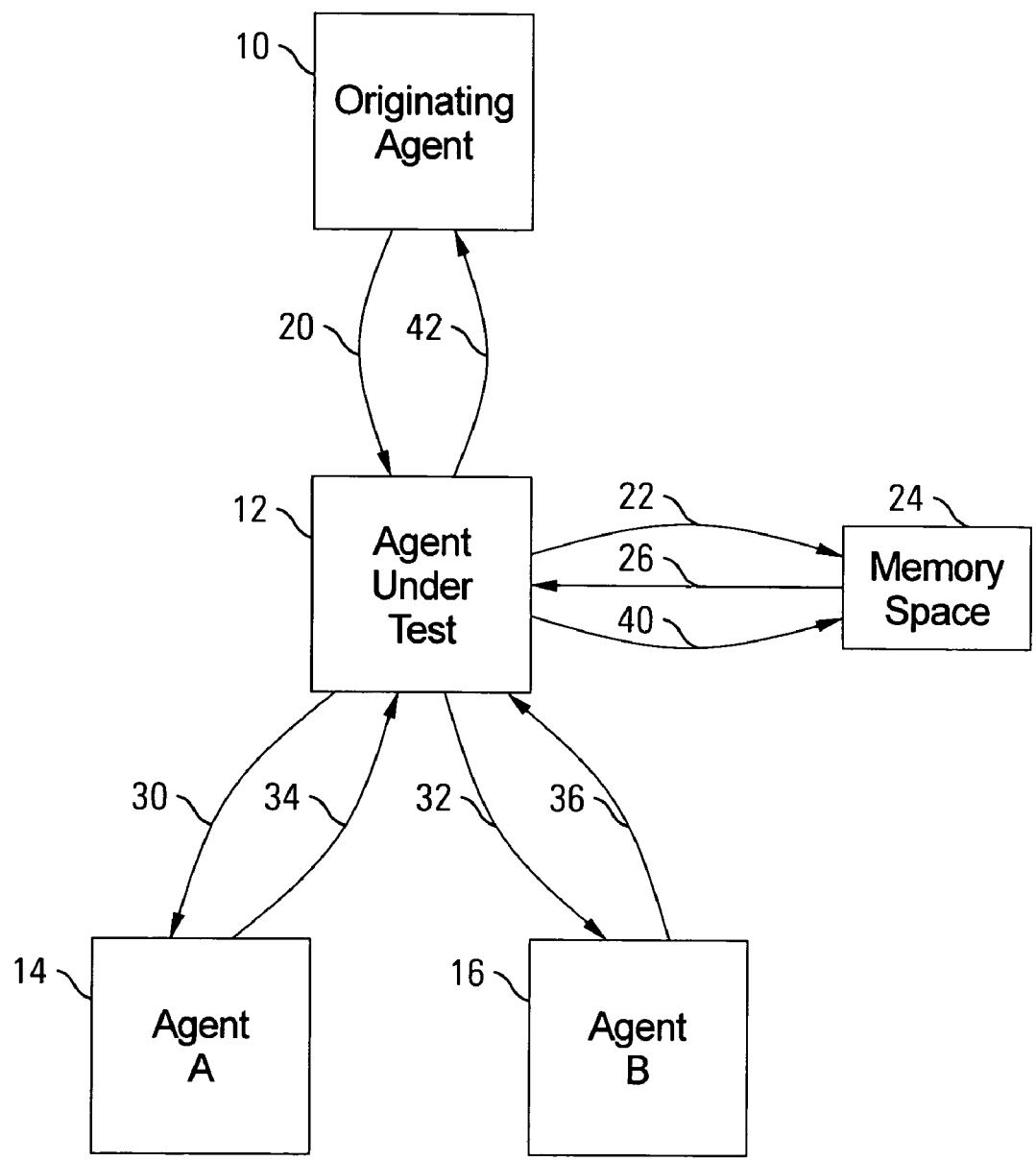
FIG. 1 is a block diagram of an exemplary group of memory agents in a computer and an exemplary memory operation in the group.

The drawing and description, in general, disclose a method and apparatus for testing an agent in a system, including storing expected outputs and correlating them with actual outputs during architectural testing. This enables black-box style testing of the agent, without requiring that the internal state of the agent be probed. The inputs and outputs of the agent are monitored, and as portions of a transaction are received by the agent, certain events may be expected to be transmitted from the agent in response. Transaction records are established to hold data relating to a transaction, and expectation records are established to hold data relating to an expected event generated by the agent. Transaction records and their associated expectation records are stored in data structures. During architectural testing of a system in which the agent is located, the operation of the agent may be tested simply by monitoring the inputs and outputs (I/O) of the agent and using transaction records and associated expectation records to verify that the agent is handling transactions properly.

The term "architecture" is used herein to refer to the physical structure, logical organization, formats, protocols and operational sequences of a computer system, including that of the hardware, (e.g., the structure and organization of a memory agent), and that of the software and firmware used in the computer system. For example, the architecture of a computer system, as referred to herein, includes the instruction set of a processor in the system, word lengths and byte-endedness, bus types and protocols, etc.

The term "agent" is used herein to refer to any component of a system that receives incoming signals or transactions and generates outgoing signals or events as a result, wherein expected values or states of the outgoing signals may be determined based on the incoming transactions, possibly in connection with other information, before the actual outgoing signals are generated by the agent. In one exemplary embodiment, the agent comprises a memory agent in a computer system.

A transaction, as the term is used herein, corresponds to an entire memory operation, and starts with a request from an originating agent to perform the memory operation. The transaction may also include snoops, read requests, and responses, etc, for a read operation, or analogous messages for other types of memory operations. The transaction ends when the memory operation is complete. In one exemplary embodiment, this is indicated when the originating agent sends a completion message.

The testing tool, or checker, for monitoring the I/O of the agent and for generating and using the transaction records and expectation records may be implemented in any suitable manner, such as in a software application or in an electronic circuit. In one exemplary embodiment, the checker is written as a software application using the C++ programming language. The checker may be used to test agents during architectural verification at any stage, including in a software simulation of an architecture and a test of actual hardware. The transaction records and expectation records may be stored in any data structure suitable for maintaining the relationship described below. In the exemplary embodiment, transaction records are stored in a transaction list vector. The vector is a container template, defined in the C++ Standard Template Library (STL), that resembles a C++ array in that it holds zero or more objects of the same type. The vector container is defined as a template class, meaning that it can be customized to hold objects of any type. Each of these objects may be accessed individually, using an iterator to step through the vector. The transaction list vector is dynamically expandable by adding new transaction records to the end of the vector. Each transaction record contains an expectation list vector for storing expectation records associated with that transaction record.

When a new transaction is detected at the input of the agent, a transaction record is created and is added to the transaction list vector. When an event expectation is generated, that is, when enough information is available to determine that an event should be generated by the agent, an expectation record is added to the expectation list vector for the appropriate transaction record. For example, if the agent receives a request to read a line of memory in a region belonging to that agent, the checker may expect to see a read request sent from the agent to a cache connected to the agent. In this example, a transaction record would be established for the memory read transaction, and an expectation record would be added to the expectation list vector in that transaction record, indicating that a read request should be sent from the agent to that cache. Similarly, if the cache returns the desired line of memory to the agent in a response, the checker adds another expectation record to the expectation list vector in that transaction record, indicating that the data in the response should be forwarded on by the agent to the originator of the transaction.

The term "stimulus" is used herein to refer generally to any input to an agent under test for which an output from the agent under test may be expected by the checker, that is, for which an expectation may be generated by the checker. This includes, for example, an initial request to perform a memory operation, the responses to snoops by the agent under test, and the responses to reads from a memory space local to the agent under test. The term "event" is used herein to refer to any output from the agent under test, which generally should be triggered by a "stimulus". Thus, the "stimulus" is the input to the agent under test which triggers an outgoing "event".

When an event takes place, that is, when the checker detects an outgoing event from the agent, the transaction is identified, and the checker searches the transaction list vector to find the appropriate transaction record. The transaction may be identified in any suitable manner. In many instances, the event may contain a transaction identification (ID). In other instances, if the event does not contain a transaction ID, the checker identifies the transaction using other information in the system such as an indication of what transaction is current, or an indication in the event of what line of memory is being sought. For example, if the transaction ID is not directly available from an outgoing event, the checker may use a C++STL map to look up transaction ID's from information contained in the outgoing event or elsewhere.

If no transaction record is found for the outgoing event in the transaction list vector, the checker signals an error, indicating that an event has occurred without having been triggered by a stimulus.

If the transaction record is found in the transaction list vector, the expectation list vector is traversed, looking for an expectation record matching this event. If none is found, the checker signals an error, indicating that an unexpected event has occurred. If a match is found, the match may be logged and the expectation record may be deleted from the expectation list vector.

If the event transmitted data, such as the requested line of memory, the data may be compared with a source value that is stored at the time of event creation. In the case of a data transmission expectation that spans multiple units, the event expectation is not deleted until the last unit of data in the expected data transmission is transmitted and compared.

Before describing the checker in more detail, an exemplary system including a memory agent being tested, and a memory operation in that system, will be described. Referring now to FIG. 1, a group of agents 10, 12, 14 and 16 in a computer system is shown. The agents 10, 12, 14 and 16 may be interconnected by a bus (not shown) or other type of interface. The checker described herein may be used to test an agent connected to other devices in a system by any bus, interface, or protocol or by any combination of buses, interfaces, or protocols in which an agent receives stimuli and transmits events based on these stimuli. In the exemplary embodiment, the agents 10, 12, 14 and 16 are interconnected by a point-to-point (P2P) link network.

A P2P link network is a switch-based network which may have one or more crossbars (not shown) acting as switches between components such as memory agents, memories, processor cores, or other devices. Messages in transactions are directed to specific components and are routed appropriately in the P2P link network by crossbars. This reduces the load on components because they don't need to examine each broadcast block of information as they would if connected by a bus. Messages in the P2P link network need not occur in any specific order. Transactions on the P2P link network are packet-based, with each packet containing a header with routing and other information. Packets containing requests, responses, and data are multiplexed, so portions of various transactions may be interspersed with many others in time. Transmissions are length-limited, with each length-limited block of data called a flit. Thus, a long packet will be broken into several flits, and transactions typically require multiple packets.

During an exemplary memory operation, the Originating Agent 10 sends data, in this case a transaction 20 requesting a line of memory, to an Agent Under Test 12. The Originating Agent 10 may comprise, for example, a processor that is attempting to read a line of memory such as an instruction to be executed. The Agent Under Test 12 queries any other devices in the system that may have a copy of the line of memory in order to obtain the most recent version for the Originating Agent 10. In this exemplary operation, the Agent Under Test 12 transmits a message 22 to a connected memory space 24 such as a cache, requesting the line of memory, and the memory space 24 returns the line of memory 26 to the Agent Under Test 12, where it is temporarily stored internally. The Agent Under Test 12 concurrently sends snoops 30 and 32 to other agents 14 and 16, respectively, in the system, requesting the line of memory from them. Agent A 14 replies with an "Invalid" message 34, indicating that the line of memory is not stored in Agent A 14 or its associated memory space (not shown). In this example, the line of memory was stored in modified form in the memory space (not shown) associated with Agent B 16. Therefore, Agent B 16 obtains the modified copy of the line of memory, either from its internal cache or in its associated memory space (not shown), and transmits the modified line of memory 36 to the Agent Under Test 12. The Agent Under Test 12 receives the modified line of memory 36 and overwrites its internal copy of the line of memory with the received modified line 36. The Agent Under Test 12 then sends a copy 40 of the modified line of memory to its memory space for storage, and sends another copy 42 of the modified line of memory to the Originating Agent 10.

Other messages (not shown) may be sent throughout the system during the memory operation, both related and unrelated to the memory operation, such as a completion message from the Originating Agent 10 to the Agent Under Test 12. Note that the sequence of transactions and events described for this memory operation are purely exemplary. The actual transactions and events involved in a memory operation are dependent on the configuration of the system, the types of interfaces between devices in the system, the type of memory operation, etc.

In this exemplary operation, the Agent Under Test 12 receives two incoming stimuli for which expectations may be generated. First, the original request 20 may result in three expectations being generated, expecting the read 22 and snoops 30 and 32 being transmitted to the memory space 24 and Agents A 14 and B 16. (Note that the generation of these three expectations depends on the checker having some information about the configuration of the system. In an alternative embodiment, the checker may not have this information, and would therefore not generate these expectations.) Second, the response 36 from Agent B 16 containing the modified line of memory 36 may result in two expectations being generated, expecting the modified line of memory being transmitted 40 and 42 to the memory space 24 and the Originating Agent 10. Note that the "Invalid" response 34 from Agent A 14 in this exemplary embodiment does not result in an event from the Agent Under Test 12. Similarly, the response 26 from the memory space 24 containing the unmodified line of memory 26 does not result in an event from the Agent Under Test 12 because the response 36 from Agent B 16 containing the modified line of memory 36 eliminates the need for the unmodified line of memory 26. Again, this exemplary embodiment relies on the checker having information about the configuration of the system, and keeping track of the state of the transaction in the system. In alternative embodiments, the checker may have different levels of information and may generate different expectations accordingly. For example, in one alternative embodiment, the checker may not keep track of the state of the transaction in the system. In this embodiment, the checker would generate an expectation based on the response 26 containing the unmodified line of memory. This expectation would generate an error when no event resulted, and the operator of the test would need to interpret the test results to determine that this was proper and could be ignored.

The checker tests only the Agent Under Test 12, and does not anticipate responses from other devices. Therefore, the line of memory 26 from the memory space 24, the "Invalid" response 34 from Agent A 14, and the modified line of memory 36 from Agent B 16 are not expected and are treated as incoming stimuli for which new expectations may be generated if appropriate. In other words, the checker is not waiting for these responses, because it is not designed to detect failures in any component of the system but the Agent Under Test 12. Each of these responses from other components may or may not result in expected events, as discussed above. For example, the "Invalid" response 34 from Agent A 14 would not result in an outgoing event from the Agent Under Test 12 unless no copy of the line of memory was available from any source in the system, in which case the Agent Under Test 12 might send an "Invalid" message to the Originating Agent 10. Note that this "Invalid" message from the Agent Under Test 12 might be expected as an event because of either the "Invalid" response 34 from Agent A 14 or the original request 20 from the Originating Agent 10. The checker may be adapted in cases like these to generate expectations from either or both, as desired.

For the present discussion, only two stimuli, the original request 20 from the Originating Agent 10 to the Agent Under Test 12 and the modified line of memory 36 from Agent B 16, will be considered.

In the first stimulus, when the checker detects the original request 20 from the Originating Agent 10 at an input to the Agent Under Test 12, the checker determines whether the transaction is new, and if so, adds a transaction record to the transaction list vector. The checker attempts to determine what events should be generated by the Agent Under Test 12 as a result of the stimulus, based upon information in the stimulus and optionally from other information in the system. For example, the checker detects that the stimulus is a request for a line of memory and that three sources should be checked for the line of memory, including the memory space 24 and the other two agents 14 and 16. Therefore, three expectation records are generated and added to the transaction record for the current transaction—a first read message 22 to the memory space 24, and snoops 30 and 32 to Agent A 14 and Agent B 16, respectively. As the checker detects each event 22, 30 and 32 at the output of the Agent Under Test 12, the checker identifies the transaction ID for each event from the event or other sources and searches the transaction list vector for the transaction record. The checker then searches the expectation list vector in the transaction record for the expectation record corresponding to the outgoing event. Information in the event is checked or verified as appropriate, such as the address of the line of memory sought. As each outgoing event is detected by the checker and the expectation record is located, the event is verified against the expectation record, and the expectation record is deleted if all was successful, or errors are signaled as discussed above.

Once a transaction is complete, the transaction record may also be deleted. However, note that the completion of all expected events does not necessarily indicate that the transaction is complete. Expectations for some events may not be discernable when the first stimulus of a transaction arrives at the agent. In other words, generation of expectations may continue at any time after the transaction begins until the transaction is officially complete, such as when the Originating Agent 10 indicates to the Agent Under Test 12 that the transaction is complete.

The second stimulus to be considered is the reception of the modified line of memory 36 from Agent B 16 by the Agent Under Test 12. In this stimulus, the checker may determine that the Agent Under Test 12 is expected to transmit the modified line of memory to its associated memory space 24 and to the Originating Agent 10. The expectation records generated for these events may contain the modified line of memory, so that when the events are detected at the output of the Agent Under Test 12, the checker may verify that the modified line of memory was correctly transmitted. As discussed above, if the modified line of memory is transmitted in multiple units, such as multiple flits or packets, the checker may collect all units and verify them before deleting the expectation record. In an alternative embodiment, the checker may generate multiple expectation records, one for each expected unit, rather than one for each event.

Note that expectations may be formulated based solely on the information contained in the transaction, or may be formulated based additionally on other information in the system or in other transactions. For example, the checker may need information from the original request 20 as well as from the response 36 containing the modified line of memory 26 to determine that the Agent Under Test 12 should transmit the modified line of memory to the Originating Agent 10, depending upon what information is contained in the response 36 containing the modified line of memory 26.

The checker will now be described in more detail, including the generation, storage and use of transaction records and expectation records, with reference to the following pseudocode:

include <vector> //Include header file for vector using std; //STL containers are defined in std //Define a structure for expectation records typedef struct{
   int EventID;
   Include other information as desired.

} ExpectationRecord;

A structure is defined to contain expectation records as above. The expectation records contain an identification of the event, and any other information as desired, dependent on the system. For example, expected data may be stored in a vector or in some other manner in the expectation record or may be associated with the expectation record using a pointer or other method. The expectation record may also indicate whether the event is a request or a response, the destination of the event, the type of the event, the address of the memory being accessed, etc.

//Define a structure for a transaction record typedef struct{
   int TransactionID;
   vector<ExpectationRecord> expectations;
   Include other information as desired.

} TransactionRecord;

A structure is defined to contain transaction records as above. The transaction records contain a transaction ID and an expectation list vector, as described above. Other information may be included as desired, dependent on the system. For example, the transaction record may contain an indication of the address of the memory being accessed, an indication of the request type (e.g., read or write), the time the transaction began and the scheduled completion time, the expected number of responses, the count of the actual number of responses, etc.

//Define a vector of transaction records vector<TransactionRecord> transactions;

A transaction list vector is defined and instantiated, containing transaction record-type objects.

void handleStimulus( )

{
   TransactionRecord*NewTrans;
   int i;
   boolean found=False;
   if initial request{
   NewTrans=new TransactionRecord;
   NewTrans.TransactionId=TransactionID;
   //Add new transaction record
   //to end of transaction vector
   transactions.push_back(NewTrans);
   addExpectation( )}
   if not initial request{
   Determine TransactionID of incoming stimulus
   for (i=0; i<transactions.size( ) i++){
     if transactions[i].TransactionID==TransactionID{
       found=True;
       exit;}} //End for loop
   if not found
     signal error;} //End "if not initial request"
}

When the checker detects an incoming stimulus, it determines the transaction ID and searches the transaction list vector for the corresponding transaction ID. If no transaction record exists for the incoming stimulus, a new transaction record is created and added to the transaction list vector. The checker may then attempt to generate expectations for that stimulus. Note that, as discussed above, expectations may be generated at any time for an outstanding transaction, not just when the transaction is first detected.

void addExpectation( )

{
   ExpectationRecord*NewExpect;
   Determine whether an event is expected, and if so, add an expectation record as follows:
   Go to appropriate transaction record
   NewExpect=new ExpectationRecord;
   NewExpect.EventId=EventID;
   transactions.expectations.push_back(NewExpect);
}

The checker determines whether an event is expected for a stimulus, as discussed above. This may be performed at any time while a transaction is outstanding, and may be based on information in the stimulus or on information obtained elsewhere in the system. The determination of whether an event is expected is dependent on the type of interface, the system configuration, the type of memory operation, etc., but may be performed as described generally above. For example, if a memory read transaction is detected at the input to a memory agent, in a P2P link network in a computer system utilizing the Modified Exclusive Shared Invalid (MESI) protocol, the memory agent may be expected to generate read or snoop events to connected memory agents or memories to determine if they have the requested data. If an expectation can be generated, the appropriate transaction record is located and a new expectation record is added to the expectation list vector in the transaction record.

void handleEvent( )

{
   Search for associated transaction record—if not found, signal error.
   Search for expectation record—if not found, signal error.

If expectation record found, verify contents of event, including data if applicable. Log the match and delete the expectation record.

}

When an event is detected at the output of the agent under test, the transaction ID for the event is determined, and the transaction list vector is searched for the associated transaction record. If no transaction record is found, the checker signals an error indicating that the event was not triggered by a known stimulus. If the transaction record is found, the expectation list vector in the transaction record is searched for the expectation record for the detected event. If no expectation record is found, the checker signals an error indicating that the event was not expected. If the expectation record is found, the checker may verify the contents of the event using information in the expectation record, including data transmitted in the event, as will be described in more detail hereinafter. After the event is complete and has been verified, the expectation record may be deleted from the expectation list vector. Similarly, when a transaction is complete, the transaction record may be deleted from the transaction list vector.

If expectation records are deleted as events go out from the agent, the expectation list vector will contain expectation records for expected events that haven't yet occurred. The checker may therefore look at the expectation list vector after a test is complete to identify events that were not generated as expected. In an alternative embodiment, the checker may impose a time limit on event expectations, so that if an event is not generated within the time limit, the checker may signal an error.

Alternatively, expectation records and transaction records may be kept or archived, particularly if they contain information that may help the checker in generating expectations for other stimuli in the transaction.

It is important to note that the pseudo-code above is purely exemplary. As discussed above, the checker may be embodied in any suitable manner, such as in one or more software applications programmed in any programming language or as one or more hardware circuits. The transaction records and expectation records may be stored in any suitable manner, and transactions and events may be monitored at the I/O of an agent in any suitable manner.

Figure 2:
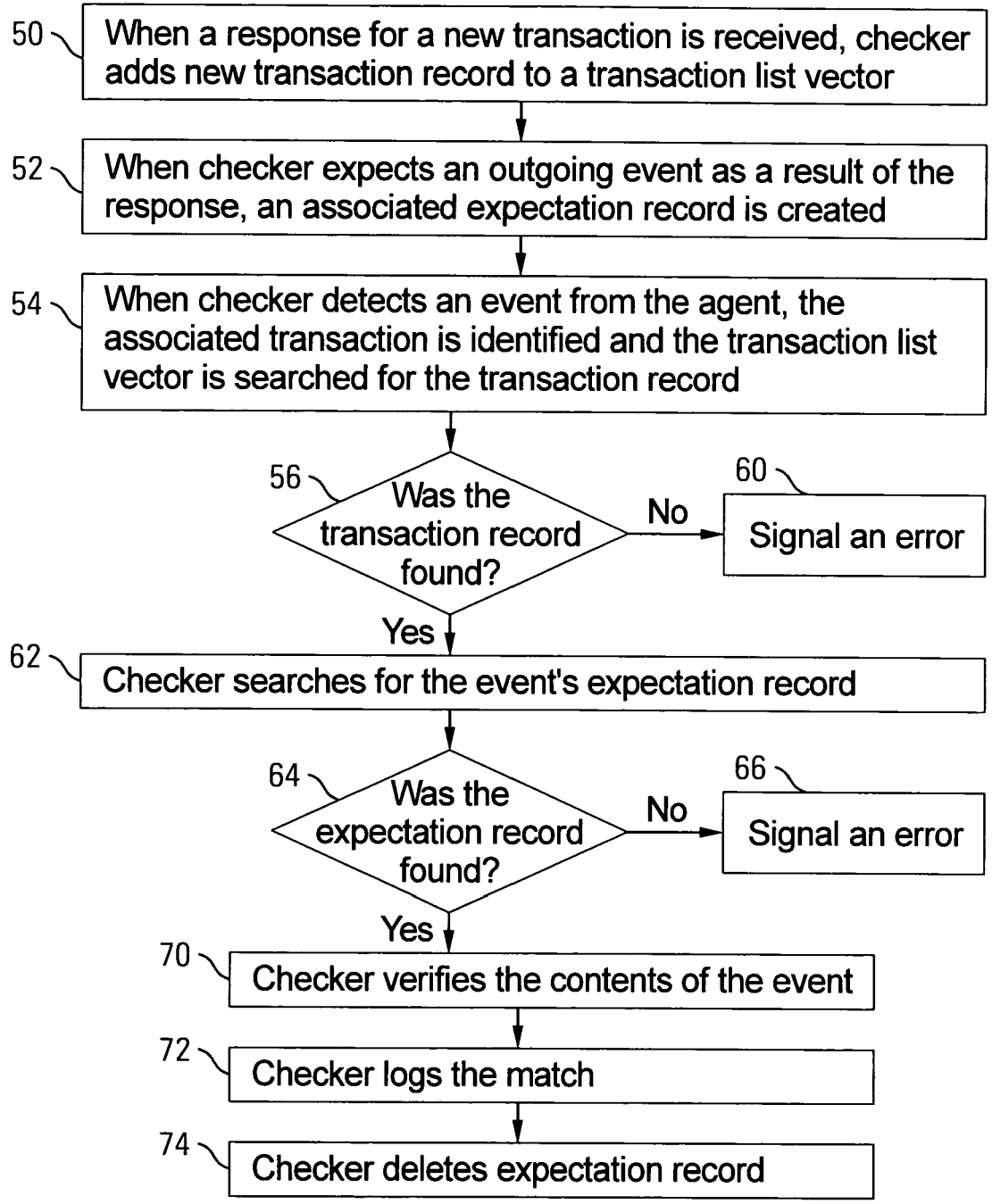
FIG. 2 is a flow chart of an exemplary operation for storing expectations and correlating them with transactions during architectural testing.

Referring now to FIG. 2, an exemplary operation for storing expectations and correlating them with transactions and stimuli during architectural testing may be summarized as follows. When a new transaction is detected 50 at the agent's input by receiving an incoming stimulus, a transaction record is created and is added to a transaction list vector by a checker monitoring the inputs and outputs of the agent. When the checker determines 52 that the agent should generate an outgoing event as a result of the stimulus, the checker stores an expectation record and associates it with the transaction record. When the checker detects 54 an outgoing event at an output of the agent, the checker identifies the associated transaction and searches the transaction list vector for the transaction record. If 56 the transaction record is not found, the checker signals 60 an error indicating that the event was generated without a triggering stimulus. If 56 the transaction record is found, the checker searches 62 the transaction's expectation list vector for the expectation record associated with the event. If 64 the expectation record is not found, the checker signals 66 an error indicating that the event was unexpected. If 64 the expectation record is found, the checker may verify 70 the contents of the event, log 72 the match and delete 74 the expectation record from the expectation list vector. As discussed above, if the event contains data such as a line of memory, the checker may also verify the data in the event. If the data spans multiple transmitted units, the expectation record is not deleted until all the expected units of data have been received and verified. It is important to note that the verification of data in the event is optional, and the method and apparatus for testing an agent in a system is not limited to the embodiments to be described below which verify data in events.

Three exemplary embodiments of verifying data when testing an agent will be described below. These three embodiments verify data differently depending upon the interface or protocol being used in the system. In the first exemplary embodiment, all incoming data must be received by the agent before any outgoing data can be transmitted. In other words, the stimulus must be fully received before an event is expected. In the second exemplary embodiment, outgoing data may be transmitted by the agent before the incoming data has been completely received. The incoming data is transmitted contiguously, that is, all portions of the incoming data are transmitted across the same virtual or physical channel and no other messages are transmitted on that virtual and physical channel until the stimulus has completed. In this embodiment, an event may be expected for a transaction before the stimulus has been fully received by the agent. The separately transmitted portions of the stimulus need not each be identified with the transaction ID or other correlative information because of this contiguity. In the third exemplary embodiment, outgoing data may also be transmitted by the agent before the incoming data has been completely received, however, portions of stimuli may be interleaved. For example, the agent may receive a portion of a first stimulus, then a portion of a stimulus for a different transaction, followed by another portion of the first stimulus. Additionally, the portions of a stimulus may be transmitted to the agent across various virtual or physical channels. Each portion of a stimulus is identified with the transaction ID or other correlative information such as the address of the line of memory and the identity of the source.

Figure 3:
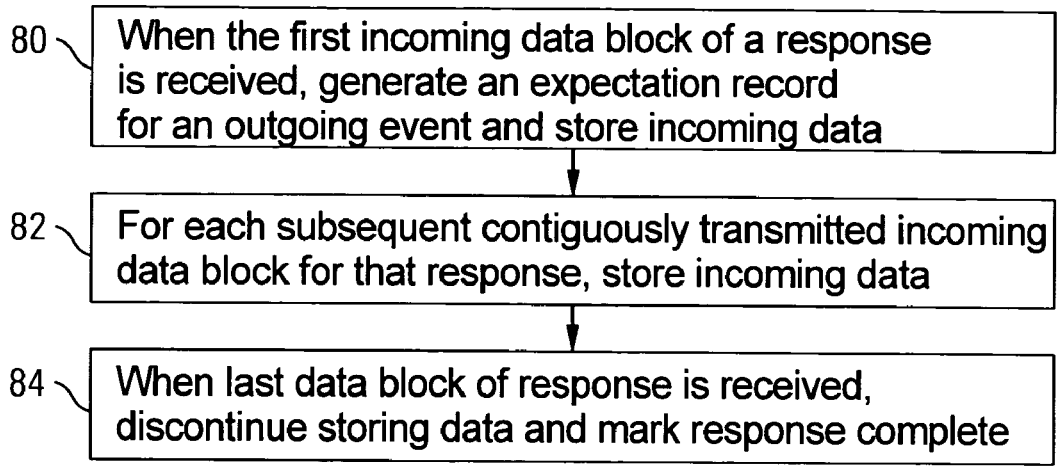
FIG. 3 is a flow chart of an exemplary operation for collecting incoming data blocks in a first exemplary embodiment.

In the first exemplary embodiment of verifying data, the checker monitors the inputs to the agent for incoming stimuli, and generates expectations for outgoing events as soon as the initial need for the agent to send data is foreseen. For example, if the exemplary system uses a P2P link network interface, a stimulus is transmitted to the agent in a packet which may be broken into multiple flits, each of which is transmitted separately. When the checker detects 80 (FIG. 3) the arrival of the first flit of data in the stimulus at the agent's input, the checker may determine that the agent should transmit data as a result, and generates an expectation of this event. For each subsequent associated data flit detected by the checker at the agent's input, the data is stored 82 in the expectation record, adding to the end of the existing expectation. Alternatively, a new expectation may be generated for each incoming data flit if the checker can determine that the outgoing data flits will be divided in the same way. When the "tail" is detected at the agent's input, indicating end of transmission for a stimulus, the checker discontinues storing of data 84 for the stimulus and stores an indication in the transaction record that the stimulus is done.

Figure 4:
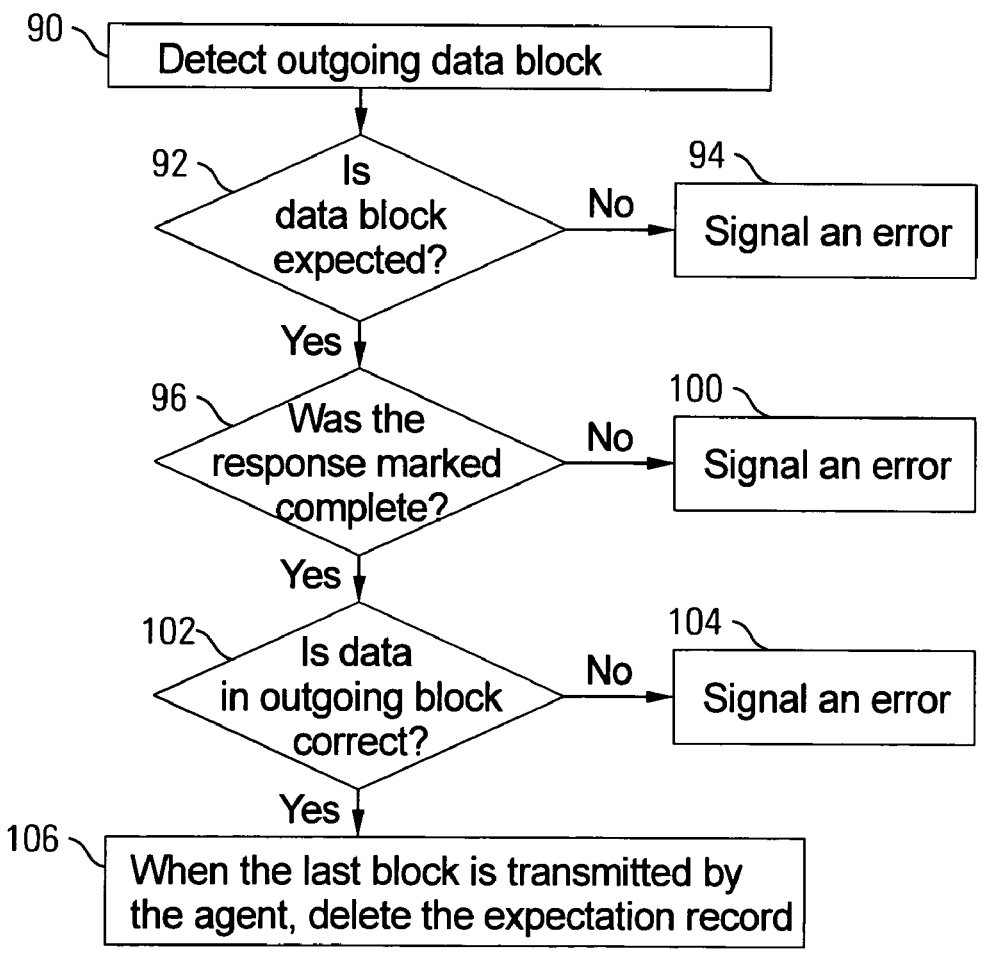
FIG. 4 is a flow chart of an exemplary operation for verifying outgoing data blocks in a first exemplary embodiment.

The checker also monitors the outputs of the agent for outgoing events. When an outgoing data flit is detected 90 (FIG. 4), the transaction ID in the flit is compared 92 with the transaction ID in the expected event, and if they do not match, the checker signals 94 an error indicating that the transaction ID was unrecognized. (Alternatively, as will be described below, correlative information other than the transaction ID may be used.) If they do match, the checker determines 96 whether the stimulus was fully received by the agent. If not, the checker signals 100 an error indicating that an event was generated before the stimulus was complete. If the stimulus was fully received by the agent, the checker compares 102 the data in the outgoing flit with the expected data stored in the expectation record. If they do not match, the checker signals 104 an error indicating that the transmitted data was incorrect. When the last flit is transmitted by the agent, the checker deletes 106 the expectation record.

Errors may be handled as desired in the testing system. In one exemplary embodiment, the test may be halted upon detection of a failure. In another exemplary embodiment, the checker may cancel processing of the failed transaction but continue testing.

The following exemplary pseudo-code illustrates the first embodiment for a system with a P2P link network interface in which stimuli comprise packets, each of which may be broken into multiple flits. Note that the following pseudo-code is not a single sequential routine, but contains multiple pieces of code that are triggered based on various circumstances, such as the detection of the last incoming data flit of a stimulus or the detection of the first outgoing data flit of an event.

Set comparison index to zero for incoming stimuli:

when first portion of data in incoming stimulus is detected, generate expectation for output event store each received portion of data for stimulus in expectation record as it is received when tail portion is received, discontinue storing data in expectation record and mark stimulus done for outgoing events:
   when data in outgoing event is detected
   if transaction ID of outgoing data is in expectation record
     for the transaction
     if the stimulus is marked as done
       if the outgoing data matches the expected data stored
         in the expectation record
         log successful match
       else (transmitted data did not match expected)
         report data mismatch error
       increment comparison index
     else (stimulus not marked as done)
       report error indicating that data was transmitted by the
         agent before the entire stimulus was received, event
         failed
   else (transaction ID in data flit not recognized) report error
     indicating that the transaction ID in the outgoing data
     was unrecognized, the event failed
   if the outgoing data flit is TAIL
     reset comparison index to zero
     delete expectation record from expectation list vector for
       the transaction In the second exemplary embodiment of verifying data, as mentioned above, outgoing data may be transmitted by the agent before the incoming data has been completely received. The incoming data is transmitted contiguously, that is, all portions of the incoming data are transmitted across the same virtual or physical channel and no other transactions are transmitted on that virtual and physical channel until the first has completed. In this embodiment, an event may be expected for a stimulus before the stimulus has been fully received by the agent. The separately transmitted portions of the stimulus need not each be identified with the transaction ID because of this contiguity.

Figure 5:
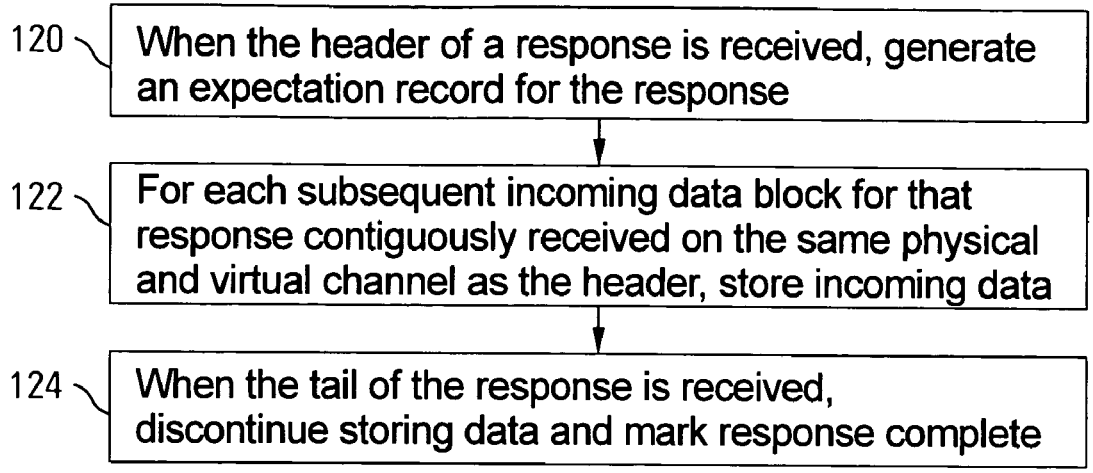
FIG. 5 is a flow chart of an exemplary operation for collecting incoming data blocks in a second exemplary embodiment.

The checker monitors the inputs to the agent for incoming stimuli and generates expectations for outgoing events as soon as the initial need for the agent to send data is foreseen. For example, if the exemplary system uses a P2P link network interface, a stimulus is transmitted to the agent in a packet which may be broken into multiple flits, each of which is transmitted separately. When the checker receives 120 (FIG. 5) a header flit, it creates an expectation record for the stimulus. The checker continues to monitor the same physical and virtual input channel on which the header flit was received. As each contiguously transmitted data flit is received 122 at the input to the agent, the checker adds the data to the expectation record. Data may be stored in any suitable manner, such as in a vector in the expectation record. When the tail incoming data flit is received, the checker discontinues 124 storing data in the expectation record.

Figure 6:
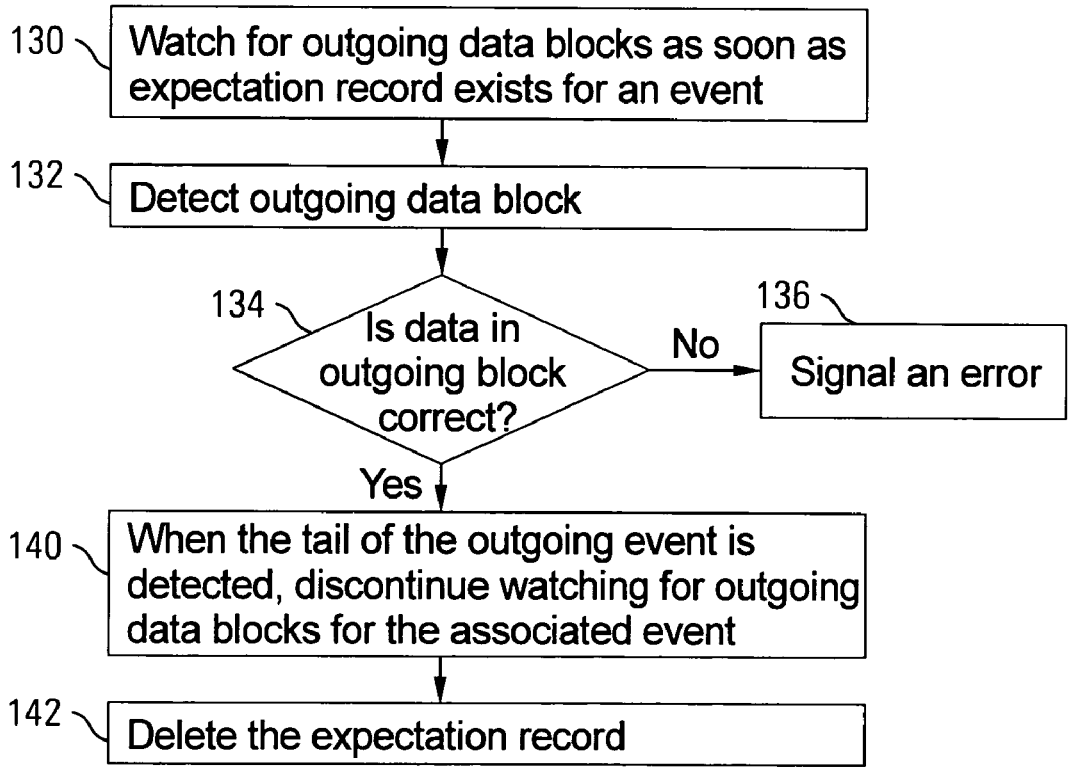
FIG. 6 is a flow chart of an exemplary operation for verifying outgoing data blocks in a second exemplary embodiment.

The checker also monitors the outputs of the agent for outgoing events. As soon as an expectation record is established for a transaction, the checker may begin watching 130 (FIG. 6) the outgoing events for output data flits corresponding to that stimulus. When an output data flit is detected 132 by the checker, the output data is compared 134 with the stored expected data. If the data does not match, the checker signals 136 an error, indicating that the data was incorrect. When the checker detects 140 the tail outgoing data flit for a stimulus, the checker discontinues watching for outgoing data flits for that stimulus and deletes 142 the expectation record for the stimulus. The checker may also verify that all expected outgoing data flits were transmitted by the agent before deleting the expectation record.

The following exemplary pseudo-code illustrates the second embodiment for a system with a P2P link network interface in which stimuli comprise packets, each of which may be broken into multiple flits. Note again that the following pseudo-code is not a single sequential routine, but contains multiple pieces of code that are triggered based on various circumstances, such as the detection of the last incoming data flit of a stimulus or the detection of the first outgoing data flit of an event.

Global (or equivalently accessible) data structures:

Data vector pointers[# of physical channels*# of virtual channels*flit structures that must be checked]

boolean read_open[same size],
   compare_open[same size];

char*currentTransactionID[same size];

int comparison_index(within expectation record);

When a new header flit is seen, set currentTransactionID [current channel] to the header's transaction ID.

Issue expectations when the initial need for the agent to send data arises, that is, when the incoming header flit for a stimulus arrives. The remaining data flits will be contiguously transmitted on the same channel, so set the read_open bit for this channel to TRUE.

Later, when the expected event's header flit is detected, set the compare_open bit for that channel to TRUE and set the associated comparison index to zero.

For an arbitrary channel, when an input flit is seen by the checker:

if (flit type==DATA) and (read_open[current channel])
   add input flit value to data vector with currentTransactionID[currentchannel] as its index For an arbitrary channel, when an output flit is seen by the checker:

if (flit type==DATA) and (compare_open[current channel])
   compare data in output flit with data vector pointer[currentTransactionID[current channel], associated comparison_index]
     if values match
       log successful match

```
    else (transmitted data did not match expected)
       report data mismatch error
       increment associated comparison_index
```

If the current channel's output flit is a TAIL (end of transmission) and compare_open[current channel] is true
   set compare_open[current channel] to FALSE
   delete data from expectation record for stimulus If the current channel's input flit is a TAIL (end of transmission) and read_open[current channel] is true
   set read_open[current channel] to FALSE In the third exemplary embodiment of verifying data, as mentioned above, outgoing data may also be transmitted by the agent before the incoming data has been completely received, however, portions of stimuli may be interleaved. For example, the agent may receive a portion of a first stimulus, then a portion of a stimulus for a different transaction, followed by another portion of the first stimulus. Additionally, the portions of a stimulus may be transmitted to the agent across various virtual or physical channels. Each portion of a stimulus, or data flit, is identified with correlative information. In this exemplary embodiment, the correlative information consists of the address of the line of memory and the identity of the source agent that transmitted the stimulus. The transaction ID is not included in the portions of the stimulus.

The checker monitors the inputs to the agent for incoming stimuli and generates expectations of outgoing events as soon as the initial need for the agent to send data is foreseen. For example, if the exemplary system uses a P2P link network interface, a stimulus is transmitted to the agent in a packet which may be broken into multiple flits, each of which is transmitted separately. Because incoming data flits for ongoing stimuli may be interleaved, the checker must correlate the various incoming data flits with the stimulus and transaction, and thus with the proper expectation record, so that the incoming data may be stored in the data vector in the expectation record for the proper transaction. In this exemplary embodiment, this is done using a "watch list". This is a list containing an entry for each stimulus for which the agent is waiting for data. For example, if a header flit has been sent to the agent as a response to a read request, the header may contain some data and may indicate that more data is on the way, for example if the response is sending a modified line of memory to the agent under test. An entry to the watch list indicates that the agent will be receiving data which should be placed in the expectation record so that the checker can be watching the agent's output to make sure the data is properly passed through the agent.

When the header flit is first seen, an entry is made to the watch list, the entry including the correlative information that will appear in each incoming data flit, such as the address of the memory line and the identity of the source. The entry also includes a pointer to the data vector of the transaction record's expectation record to which the incoming data flit belongs. As each incoming flit containing data is received (which may include the header), the correlative information is read from the incoming flit, and the watch list is searched for an entry containing that same correlative information, for example, the same source ID and memory address. If multiple transactions are taking place in the system simultaneously, multiple watch lists may exist, so the checker would need to look through each entry of several watch lists until the correct entry is located.

When the appropriate watch list entry is located, the data in the incoming flit is copied to the location to which the watch list entry pointer is directed, that is, into the data vector in the expectation record for the stimulus.

The proper position in the data vector may be identified in any suitable manner. For example, if the data is stored in the expectation record in a vector, and if it can be assumed that data flits arrive in order in the given interface, the pointer in the watch list may point at the address of the data vector, and the newly arrived data may be added to the end of the data vector by typecasting the pointer with the data vector's type and using the add command to place the new data at the end of the vector. Other alternatives may be used as desired, such as dynamically allocating memory for an entry in a list of expected data at the arrival of each incoming data flit and adjusting the pointer in the watch list accordingly, etc.

The watch list is thus used to copy incoming data into the appropriate expectation record. In an alternative embodiment, the checker could use the correlative information to look up the transaction ID for each incoming data flit, then determine the appropriate expectation record for the stimulus, then determine where in the data vector of the expectation record the incoming data should be stored. In another alternative embodiment, transaction ID's and expectation ID's may be equivalent to the correlative information used in the particular system, if these are unique values that may be used as identifiers for transaction records and expectation records. For example, the transaction ID may correspond to the address of the line of memory and the expectation ID may correspond to the identity of the source of the stimulus.

Figure 7:
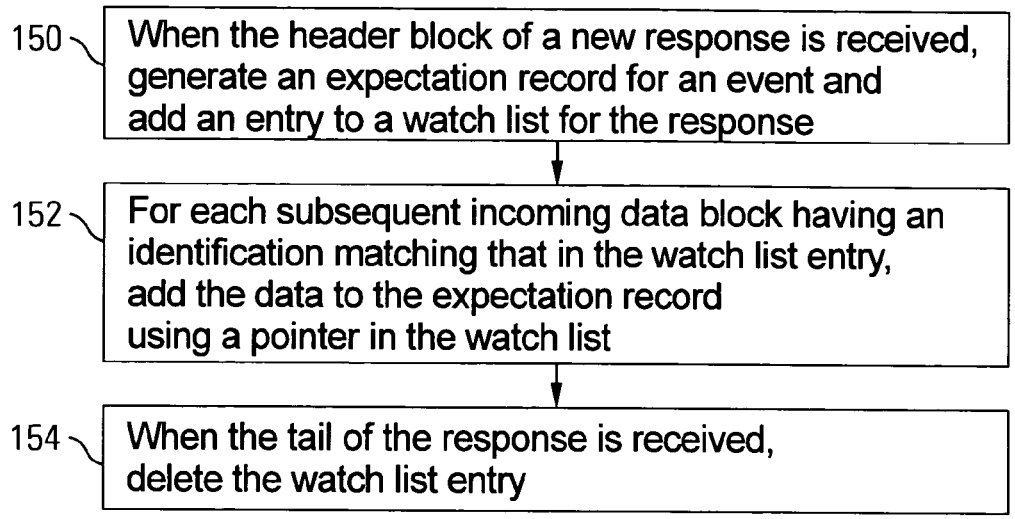
FIG. 7 is a flow chart of an exemplary operation for collecting incoming data blocks in a third exemplary embodiment.
Figure 8:
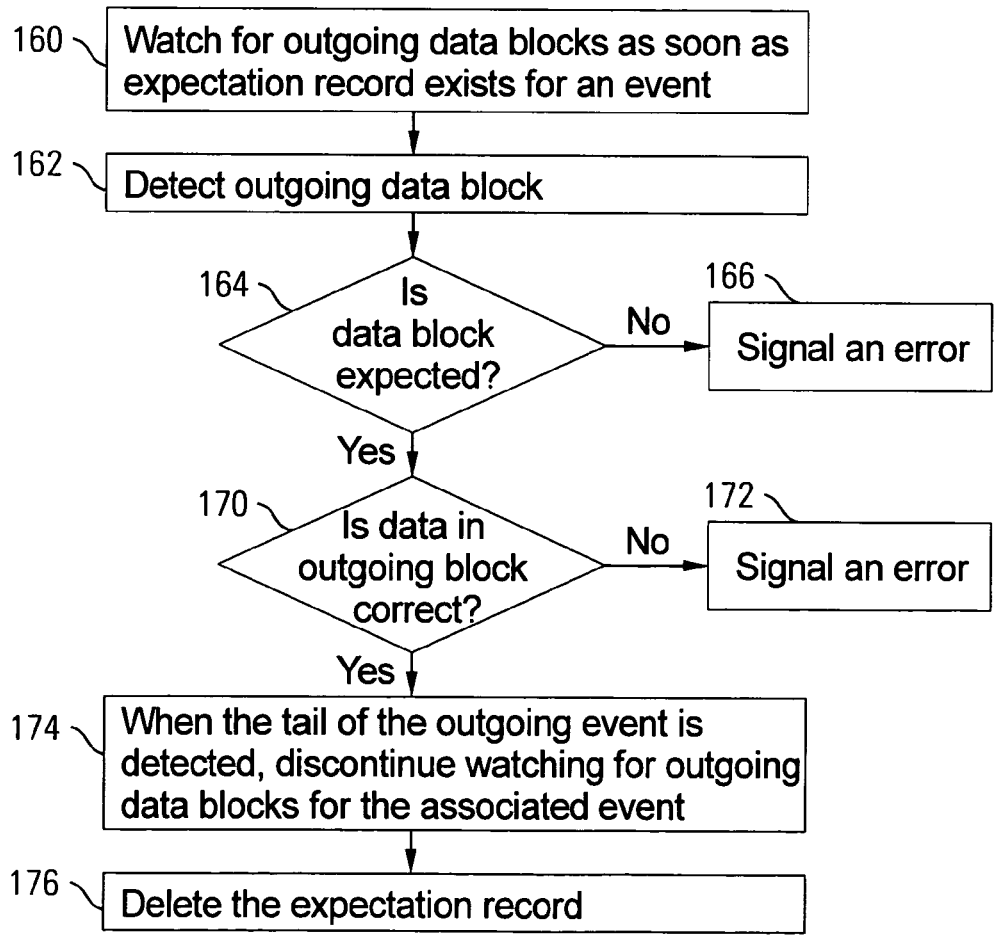
FIG. 8 is a flow chart of an exemplary operation for verifying outgoing data blocks in a third exemplary embodiment.

Again, the checker establishes a "watch list" for each ongoing transaction, each watch list containing a list of stimuli currently being received, or pending receipt, by the agent. When the checker receives 150 (FIG. 7) the header block of a new stimulus, an expectation record is generated for an outgoing event and a watch list entry is added for the stimulus to the watch list for the appropriate transaction. As each successive incoming data flit is detected, its data is added 152 to the expected data list or data vector in the expectation record. If the incoming data flit is a TAIL (end of transaction) flit, the watch list entry for the associated stimulus is deleted 154, since no more incoming data is expected for that stimulus.

Outgoing data flits are each stamped with the correlative information used to identify the corresponding transaction and expectation, so the watch list is not needed to correlate outgoing data flits with the expectation record. For example, outgoing data flits may be stamped with the transaction ID. In addition, the checker may use the fact that the outgoing flit is a data flit to aid in identifying the corresponding expectation, as well as the direction of the flit and its type, etc. A comparison index is used by the checker as an index into the data vector in the expectation record, indicating which outgoing data flit is next expected.

The checker may begin watching 160 for outgoing data flits for an event as soon as an expectation record exists. When an outgoing data flit is detected 162 at an output of the agent, the checker determines 164 whether the outgoing data flit is expected. This is done by determining whether the transaction ID and expectation ID in the outgoing data flit correspond to an outstanding expectation record. If the outgoing data flit is not expected, the checker signals 166 an error indicating that the outgoing data flit did not correspond to a stimulus based on which an event was expected. If the outgoing data flit was expected, the value of the data in the outgoing data flit is compared 170 with the expected value stored in the expectation record using the comparison index described above. If the data does not match, an error is signaled 172 indicating that the outgoing data was incorrect. The checker then increments the comparison index so that it will be comparing the next outgoing data flit in the event with the next portion of expected data in the expectation record. When the last expected outgoing data flit is detected 174 (the TAIL), the comparison index is reset and the expectation record for the outgoing data is deleted 176.

The expectation may be closed by the checker when all outgoing data flits have successfully been transmitted by the agent. In one exemplary embodiment, this may be when the TAIL outgoing data flit is detected by the checker.

The following exemplary pseudo-code illustrates the third embodiment for a system with a P2P link network interface in which stimuli comprise packets, each of which may be broken into multiple flits. Note again that the following pseudo-code is not a single sequential routine, but contains multiple pieces of code that are triggered based on various circumstances, such as the detection of the last incoming data flit of a stimulus or the detection of the first outgoing data flit of an event.

When incoming data will trigger data output from the agent:

Issue expectations when the initial need for the agent to send data arises, and add "watch list" entry for the stimulus.

Pass a pointer to the data vector in the expectation record to the new watch list entry, such that data may later be copied into the expectation record.

When an incoming data flit is received having the same correlative information as a watch list entry, its data is copied into the associated expectation record via the pointer. If the incoming flit is a TAIL (end of transaction) flit, the associated watch list entry is deleted.

When outgoing data leaves the agent:

if Transaction ID of outgoing data flit is in an expectation record for some transaction
   compare outgoing data flit's value with that in the expectation record
     if values are equal
       log successful match
     else (transmitted data did not match expected)
       report data mismatch error
     increment comparison index else (unrecognized transaction ID)
   signal error indicating that the event was not affiliated with a transaction if outgoing data flit is TAIL (end of transmission)
   reset comparison index
   delete expectation record Various computer readable or executable code or electronically executable instructions have been referred to herein. These may be implemented in any suitable manner, such as software, firmware, hard-wired electronic circuits, or as the programming in a gate array, etc. Software may be programmed in any programming language, such as machine language, assembly language, or high-level languages such as C or C++. The computer programs may be interpreted or compiled.

Computer readable or executable code or electronically executable instructions may be tangibly embodied on any computer-readable storage medium or in any electronic circuitry for use by or in connection with any instruction-executing device, such as a general purpose processor, software emulator, application-specific circuit, a circuit made of logic gates, etc. that can access or embody, and execute, the code or instructions.

Methods described and claimed herein may be performed by the execution of computer readable or executable code or electronically executable instructions, tangibly embodied on any computer-readable storage medium or in any electronic circuitry as described above.

A storage medium for tangibly embodying computer readable or executable code or electronically executable instructions includes any means that can store the code or instructions for use by or in connection with the instruction-executing device. For example, the storage medium may include (but is not limited to) any electronic, magnetic, optical, or other storage device. The storage medium may even comprise an electronic circuit, with the code or instructions represented by the design of the electronic circuit. Specific examples include magnetic or optical disks, both fixed and removable, semiconductor memory devices such as memory cards and read-only memories (ROMs), including programmable and erasable ROMs, non-volatile memories (NVMs), optical fibers, etc. Storage media for tangibly embodying code or instructions also include printed media such as computer printouts on paper which may be optically scanned to retrieve the code or instructions, which may in turn be parsed, compiled, assembled, stored and executed by an instruction-executing device.

While illustrative embodiments have been described in detail herein, it is to be understood that the concepts disclosed herein may be otherwise variously embodied and employed, and that the appended claims are intended to be construed to include such variations, except as limited by the prior art.

What is claimed is:

1. A computer implemented method of verifying events generated by an agent, said method comprising:
    detecting an input signal at an input of said agent;
    creating a transaction record corresponding to said input signal, each transaction record including storage for expectation records associated with that transaction record;
    generating an expected output signal, corresponding to said transaction record, based at least in part on said input signal; and
    signaling an error when said agent does not generate said expected output signal corresponding to said transaction record.

2. The method of claim 1, where the step of signaling an error further comprises signaling an error when said expected output does not occur.

3. The method of claim 1, where the step of signaling an error further comprises signaling an error when said expected output does not occur within a predetermined time.

4. The method of claim 1, where the step of signaling an error further comprises signaling an error when no transaction record can be identified for an output.

5. The method of claim 1, where the step of signaling an error further comprises signaling an error when a transaction record for an output is not recognized.

6. The method of claim 1, where the step of signaling an error further comprises signaling an error when a transaction record for an output signal corresponds to said transaction record corresponding to said input signal, but said output signal is not expected.

7. The method of claim 1, where the step of signaling an error further comprises signaling an error when a transaction record for an output signal corresponds to said transaction record corresponding to said input signal, but said output signal is generated before said input signal is complete.

8. An apparatus for producing expectations to verify events generated by an agent; comprising:
   a. at least one computer readable medium; and
   b. computer readable program code stored on said at least one computer readable medium, said computer readable program code comprising:
      i. program code for monitoring at least one input of said agent for a stimulus;
      ii. program code for creating a transaction record corresponding to said stimulus, each transaction record including storage for expectation records associated with that transaction record;
      iii. program code for generating an expectation of an event, corresponding to said transaction record, based at least in part on said stimulus, wherein said event is expected to be generated by said agent as a result of said stimulus; and
      iv. program code for signaling an error when said agent does not generate said event corresponding to said transaction record.

9. The apparatus of claim 8, further comprising program code for signaling an error if said event is detected at said at least one output for which no expectation has been produced.

10. The apparatus of claim 8, wherein said program code for monitoring said at least one input of said agent for said stimulus comprises program code for monitoring at least one input of a memory agent for said stimulus, said stimulus being selected from a group consisting of an initial request to perform a memory operation, a snoop response, and a read response.

11. The apparatus of claim 8, wherein said program code for monitoring said at least one input of said agent for said stimulus comprises program code for identifying said stimulus using correlative information in said stimulus.

12. The apparatus of claim 11, wherein said correlative information comprises a transaction identification.

13. The apparatus of claim 11, wherein said correlative information comprises an address of memory being accessed by said stimulus and an identity of a source of said stimulus.

14. The apparatus of claim 8, wherein said program code for monitoring said at least one input of said agent for said stimulus comprises program code for gathering said stimulus from a plurality of separately transmitted portions.

15. The apparatus of claim 8, wherein said program code for creating a transaction record comprises program code for creating a transaction record to contain information relating to a memory transaction involving said agent.

16. The apparatus of claim 15, wherein said program code for producing said expectation of said event further comprises:
   program code for creating an expectation record to contain information relating to an expected event from said agent; and
   program code for associating said expectation record with said transaction record.

17. The apparatus of claim 8, wherein said program code for producing said expectation of said event comprises program code for storing expected data associated with said expectation, said expected data being received in a plurality of separate incoming transmissions in said stimulus, said expected data being expected to be transmitted by said agent in a plurality of separate outgoing transmissions in said event.

18. The apparatus of claim 17, further comprising:
   program code for comparing said expected data with actual data in said event;
   program code for signaling an error if said expected data does not match said actual data; and
   program code for signaling an error if said actual data is not expected.

19. The apparatus of claim 17, further comprising program code for signaling an error if any of said plurality of separate outgoing transmissions is detected before all of said plurality of separate incoming transmissions have been received.

20. The apparatus of claim 17, wherein said program code for monitoring said at least one output of said agent for said event begins monitoring said at least one output for said plurality of separate outgoing transmissions as soon as a first of said plurality of separate incoming transmissions has been received.

21. The apparatus of claim 20, wherein said program code for storing said expected data comprises identifying said first of said plurality of separate incoming transmissions using correlative information in said first of said plurality of separate incoming transmissions and further comprising identifying subsequent transmissions of said plurality of separate incoming transmissions by their being contiguously transmitted on a same input of said agent as said first.

22. The apparatus of claim 21, wherein said same input of said agent comprises a same physical and virtual input channel.

23. The apparatus of claim 20, wherein said program code for storing said expected data comprises identifying each of said plurality of separate incoming transmissions using correlative information in said each of said plurality of separate incoming transmissions to enable gathering and sorting of interleaved transmissions belonging to different stimuli.

24. An apparatus for testing an agent in a computer system, comprising:
   means for detecting at least one incoming message as it is received by said agent;
   means for generating a transaction record corresponding to said incoming message, each transaction record including storage for expectation records associated with that transaction record;
   means for generating at least one expected outgoing message, correlated to said transaction record, that should be produced by said agent in response to said incoming message, wherein said at least one expected outgoing message is generated at least in part based on said at least one incoming message; and
   means for signaling an error when said agent does not generate said expected outgoing message corresponding to said transaction record.

25. An apparatus for producing expectations to verify events generated by an agent, comprising:
   a. at least one computer readable medium; and
   b. computer readable program code stored on said at least one computer readable medium, said computer readable program code comprising:
      i. program code for monitoring at least one input of said agent for a stimulus;
      ii. program code for creating a transaction record corresponding to said stimulus, each transaction record including storage for expectation records associated with that transaction record;
      iii. program code for generating an expectation of an event, corresponding to said transaction record, based at least in part on said stimulus, wherein said event is expected to be generated by said agent as a result of said stimulus; and
      iv. program code for signaling an error when said agent does not generate said event corresponding to said transaction record;

wherein said program code for monitoring said at least one input of said agent for said stimulus comprises program code for gathering said stimulus from a plurality of separately transmitted portions;

wherein said program code for gathering said stimulus from said plurality of separately transmitted portions comprises program code for establishing a watch list, said watch list containing an entry for each stimulus for which said separately transmitted portions are being awaited, and wherein said program code for monitoring said at least one input of said agent for said stimulus comprises:

program code for detecting one of said separately transmitted portions at said at least one input;

program code for searching said watch list for said stimulus for which said one of said separately transmitted portions was being awaited; and program code for adding said one of said separately transmitted portions to said stimulus.

* * * * *